United States Patent [19]

Kendall

[11] Patent Number: 4,461,961
[45] Date of Patent: Jul. 24, 1984

[54] ACCURATE HIGH SPEED ABSOLUTE VALUE CIRCUIT AND METHOD

[75] Inventor: Larry J. Kendall, San Jose, Calif.

[73] Assignee: Memorex Corporation, Santa Clara, Calif.

[21] Appl. No.: 322,900

[22] Filed: Nov. 19, 1981

[51] Int. Cl.³ .............................................. H03K 5/00
[52] U.S. Cl. ................................... 307/261; 307/262; 328/26; 328/159
[58] Field of Search ......................... 328/26, 159, 160; 307/261, 262; 324/355

[56] References Cited

U.S. PATENT DOCUMENTS

| | | | |
|---|---|---|---|
| 3,629,567 | 12/1971 | Bryggeman | 328/160 |
| 4,053,796 | 10/1977 | Van De Plassche | 328/160 |
| 4,069,460 | 1/1978 | Sauer | 307/262 |
| 4,158,882 | 6/1979 | Citta | 328/26 |
| 4,362,956 | 12/1982 | Ogasawara et al. | 328/26 |

Primary Examiner—Stanley D. Miller
Assistant Examiner—B. P. Davis
Attorney, Agent, or Firm—David W. Heid; Nathan Cass; Kevin R. Peterson

[57] ABSTRACT

The absolute value circuit of the invention comprises differential voltage to current converter means for converting an input voltage of alternating polarity into a pair of currents whose difference represents the input voltage, first and second inverter means for separately inverting each of the two currents, means for connecting the output of each inverter to the input of the other, the inverters being of the type which will only invert current of a predetermined polarity, and current summer and clamp means which are supplied with the outputs of the inverters for generating a unipolar output current signal whose magnitude represents the difference of absolute values of the pair of currents.

13 Claims, 4 Drawing Figures

U.S. Patent     Jul. 24, 1984     4,461,961
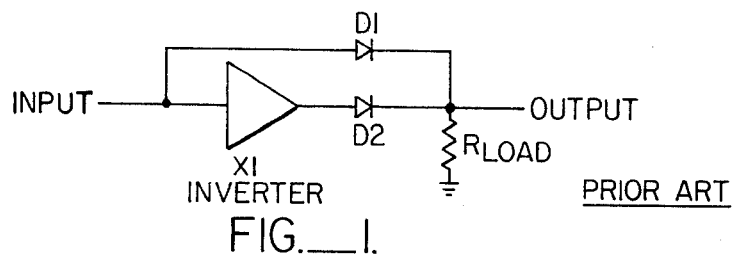
FIG._1.
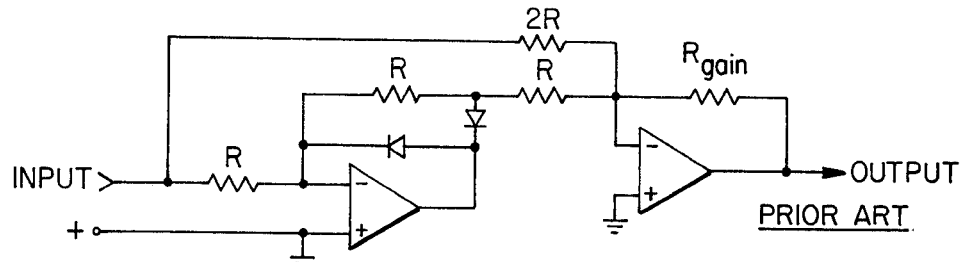
FIG._2.
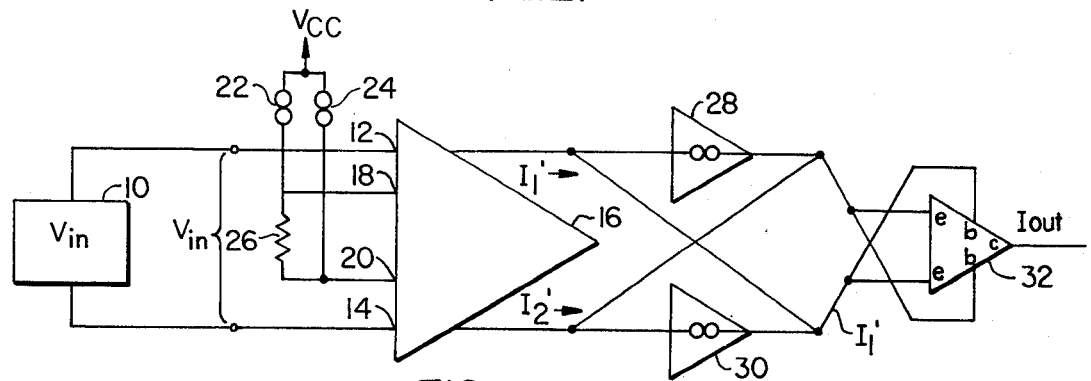
FIG._3.
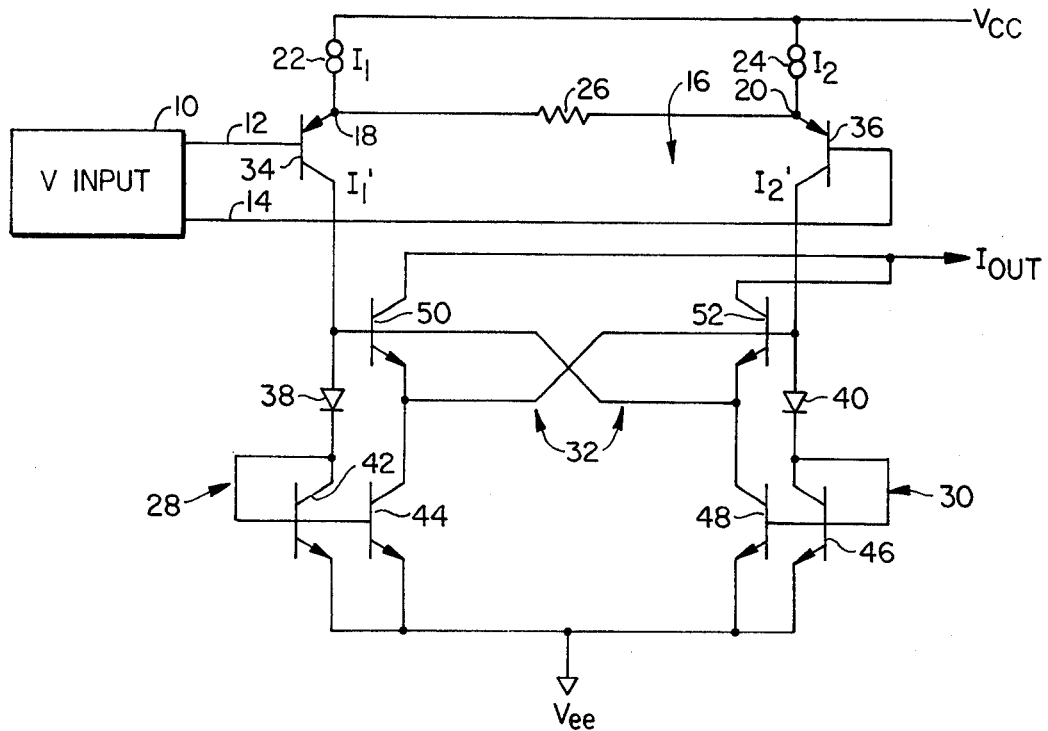
FIG._4.

ACCURATE HIGH SPEED ABSOLUTE VALUE CIRCUIT AND METHOD

BACKGROUND OF THE INVENTION

This invention relates to an electronic circuit and method for converting a voltage signal of alternating polarity into a unipolar output signal and more particularly to a high speed absolute value circuit and method.

A simple absolute value network can be constructed with a unitary signal inverter, two rectifier diodes, and a load as illustrated in FIG. 1.

The signal inverter could be active as shown or passive, such as a transformer. The circuit depicted in FIG. 1, with proper components, can be very fast but accuracy suffers due to the non-ideal nature of the diodes. Various methods are known and have been used to cancel these effects; however, the nonlinear nature of the diodes are difficult to cancel completely without affecting speed.

Referring now more particularly to FIG. 2, an active absolute value network, the most widely used method of cancelling the diode effects places the diodes within the feedback of operational amplifiers, thereby reducing the diodes' effects by the open-loop gain of the amplifiers.

While the circuit depicted in FIG. 2 almost completely eliminates the D.C. and low frequency errors, it suffers from increased errors as the open loop gain decreases with an increase in frequency. There are several types of active absolute value networks with various trade-offs of complexity, frequency response, and accuracy.

What is needed is an absolute value circuit which has high speed and a high accuracy which is not especially frequency dependent.

SUMMARY OF THE INVENTION

The foregoing objectives are achieved and the disadvantages of prior art circuits are overcome by the absolute value circuit and method of the present invention which comprises differential voltage to current converter means for converting an input voltage of alternating polarity into a pair of currents whose difference represents the input voltage, first and second inverter means for separately inverting each of the two currents, means for connecting the output of each inverter to the input of the other, the inverters being of the type which will only invert current of a predetermined polarity, and current summer and clamp means which are supplied with the outputs of the inverters for generating a unipolar output current signal whose magnitude represents the difference of the absolute values of the pair of currents and therefore representative of the absolute voltage of the input.

In the preferred embodiment of the invention the differential voltage to converter means comprise an impedance, two current sources and first and second amplifiers each having an emitter terminal, a base terminal, and a collector terminal. The impedance is connected between the emitter terminals and the current sources are each connected to a separate one of the emitter terminals. The voltage input signal is applied between the base terminals. The differential currents are then derived from the collector output terminals of the two amplifiers. Depending on the nature of the desired output currents the impedance could be a resistance, inductor or capacitance. In the case of an inductance, the difference between the currents of the collectors of the two amplifiers will represent the time integral of the voltage input. In the case that the impedance is a capacitor, the difference between the currents at the collectors of the amplifiers will represent the differential with respect to time of the voltage input.

The inverters and the clamp and summer means, in the preferred embodiment comprise bias means, first and second diodes, third, fourth, fifth, sixth, seventh and eighth amplifiers, each of which has a separate emitter, base and collector terminal. The collector of the first amplifier, that is the amplifier producing the first differential current, is connected to the anode of the first diode, the base of the seventh amplifier, the emitter of the eighth amplifier and to the collector of the sixth amplifier. The collector of the second amplifier, that is the amplifier producing the second differential current, is connected to the anode of the second diode, the base of the eighth amplifier, the emitter of the seventh amplifier and to the collector of the fourth amplifier.

The cathode of the first diode is connected to the collector and base of the third amplifier and to the base of the fourth amplifier. The cathode of the second diode is connected to the collector and the base of the fifth amplifier and to the base of the sixth amplifier. The emitters of the third, fourth, fifth and sixth amplifiers are all connected to the bias means and the collectors of the seventh and eighth amplifiers are connected together to produce an output terminal from which a unipolar output current is derived. This output current represents the absolute value of twice the current flowing through the impedance connected between the emitters of the first and second amplifiers.

In the embodiment in which the impedance is a capacitor, storage disc servo head means can be used to generate the input voltage signal. This input voltage signal has a triangular wave form representing the passage of the servo head over the servo bands on the storage disk. The difference between the currents produced by the first and second amplifier represents the differential with respect to time of this voltage input signal which, in turn, represents the velocity of the servo head as it passes over the servo bands on the storage disk. By knowing the servo head velocity the controller for the servo head can, through preprogramming, accelerate or decelerate the servo head to most efficiently and quickly address a particular data band relative to two known servo bands.

In other embodiments the voltage input signal is derived from the current supplied to an electric motor, for example. In such embodiments the impedance can be an inductor so that the output currents from the first and second amplifiers represent the time integral of the input voltage. Where this motor is a servo motor the motor current will represent the acceleration of the item being moved by the servo motor so that the time integral of the voltage input signal will represent the velocity of the item being moved by the servo motor. In other instances, this same circuit can be used to generate a signal representing the position of the item moved by the servo motor.

It is therefore an object of the present invention to provide an accurate absolute value circuit.

It is another object of the invention to provide a high speed absolute value circuit.

It is still a further object of the invention to provide a high speed and accurate absolute value circuit.

The foregoing and other objectives, features and advantages of the invention will be more readily understood upon consideration of the following detailed description of certain preferred embodiments of the invention, taken in conjunction with the accompanying drawings.

BRIEF DESCRIPTION OF THE DRAWINGS

FIGS. 1 and 2 are schematic diagrams of prior art absolute value circuits;

FIG. 3 is a block diagram of the absolute value circuit according to the invention; and FIG. 4 is a schematic diagram of the absolute value circuit according to the invention.

DETAILED DESCRIPTION OF CERTAIN PREFERRED EMBODIMENTS

Referring now more particularly to FIG. 3 a source 10 for generating an alternating polarity input voltage $V_{in}$ is connected to separate inputs 12 and 14 of differential amplifier means 16. Two separate inputs 18 and 20 of the unit 16 are connected to the separate current generators 22 and 24 which generate currents $I_1$ and $I_2$, respectively. An impedance 26 is connected between the terminals 18 and 20.

The unit 16 produces two output currents $I_1'$ and $I_2'$ whose difference represents the voltage $V_{in}$. These currents are supplied to the inputs of separate current inverters 28 and 30, each of whose outputs is tied to the input of the opposite current inverter. A current summer and clamp unit 32 is provided with a pair of control input terminals, labeled b, and a pair of signal input terminals each labeled e in the Figure. The unit 32 also has an output terminal labeled c in the Figure. Each b terminal is connected along with an e terminal on the opposite side of the unit 32 to the output of a different one of the inverters 28 and 30.

In operation, if the magnitude of the current $I_1'$ is greater than the magnitude of the current $I_2'$ then the input to the inverter 30 will have a negative polarity $(-I_1' > I_2')$. It is assumed in this case that the currents have a positive polarity as shown in the Figures although in other embodiments the polarity of all the currents could be reversed with the same effect.

The inverters 28 and 30 are designed such that they only invert currents of a predetermined polarity, which in the circuit depicted in FIGS. 3 and 4 is a positive polarity. Thus the output of the inverter 28 and the current $I_2'$ will be supplied to one set of b and e terminals of the current summer and clamp unit 32 to produce an output current which is equal to the current $I_2' - I_1'$. The current summer and clamp unit will not pass to its output the current $I_1'$ because a signal of the wrong polarity is applied to the corresponding control terminal b.

The net result is a unipolar output current which is equal to twice the absolute value of the current flowing through the impedance 26 and represents the absolute value of the voltage input signal $V_{in}$.

If the impedance 26, instead of being a resistance as shown in the Figure, is a capacitor, then the difference between the currents $I_1'$ and $I_2'$ will represent the differential with respect to time of $V_{in}$. If the impedance 26 is an inductor then the difference between the currents will represent the integral with respect to time of $V_{in}$.

In the case where the impedance 26 is a capacitor, the unit 10 which generates $V_{in}$ can advantageously be a storage disc servo head. The odd servo bands produce a signal in the servo head which, for example, could be a positive polarity signal whereas the even servo bands would produce a negative polarity signal. Thus the output from the servo head 10 in passing over the bands would be a triangular wave form of alternating polarity. The slope of this wave form, that is its differential with respect to time, represents the velocity of the servo head in passing between servo bands. Thus if the impedance 26 is a capacitor, as mentioned above, the output current will represent the velocity of the servo head regardless of whether it is passing over an odd or an even band.

In other operations the unit 10 could be a voltage representing the current derived from the supply to an electric motor which is moving a servo device. In some cases this electric current represents the acceleration of the device being operated by the servo motor. In such cases if the impedance 26 is an inductor then the output current will represent the velocity of the device being moved by the servo motor. In other situations if the unit 10 voltage represents the velocity of the device being moved then by having an inductor as the impedance 26 the output current will represent the distance traveled by the device being operated by the servo motor. This would be true regardless of whether or not the device is actually being accelerated and then decelerated.

Referring now more particularly to FIG. 4 the details of the embodiment are depicted. $V_{in}$ is supplied through the terminals 12 and 14 to the bases of transistor amplifiers 34 and 36. The emitter of amplifier 34 is connected to the input terminal 18 and the emitter of the amplifier 36 is connected to the input terminal 20. The output of the amplifier 34 at its collector is the current $I_1'$ and the output at the collector of the amplifier 36 is the current $I_2'$.

Together the current sources 22 and 24, the first and second amplifiers 34 and 36 and the impedence 26 comprise the differential voltage to current converter means.

The collector of the amplifier 34 is connected to the anode of a diode 38, the base of a transistor amplifier 50, the emitter of a transistor amplifier 52 and to the collector of a transistor amplifier 48.

The collector of the transistor amplifier 36 is connected to the anode of a diode 40, the base of a transistor amplifier 52, the emitter of the transistor amplifier 50 and to the collector of a transistor amplifier 44.

The cathode of the diode 38 is connected to the collector and base terminals of a transistor amplifier 42 and to the base terminal of a transistor amplifier 44. The cathode of the diode 40 is connected to the collector and base terminals of a transistor amplifier 46 and to the base terminal of the transistor amplifier 48. The emitters of the transistor amplifiers 42, 44, 46, and 48 are all connected in common to a bias source $V_{ee}$.

The collectors of the transistors 50 and 52 are connected together. An output current $I_{out}$ is derived from this common connection. This current is equal to two times the absolute value of the current flowing through the impedance 26 which represents the voltage input to the terminals 12 and 14. Due to the cross-coupling of the inverters, whichever current $I_1'$ or $I_2'$ is greater will control the operation of the circuit.

If $I_1'$ is greater than $I_2'$ then the anode of the diode 38 will be high, being approximately equal to 1.2 volts above the bias voltage $V_{ee}$. The transistors 42, 44 and the diode 38 will be conducting and the collector current of the transistor 44 will be equal to $-I_1'$. This current is larger than $I_2'$; therefore the anode of the diode 40 will be pulled low, being approximately equal to 0.6 volts above $V_{ee}$. This causes the transistors 46 and 48 and the diode 40 to be non-conducting. The anode of the diode 40 is clamped by the action of the transistor 50 to be at the voltage level of the anode of the diode 38 $-V_{be}$, 50 or at about 0.6 volts above $V_{ee}$, which both turns off the transistors 46 and 48, the diode 40 and prevents the transistor 44 from entering saturation. The sum of $-I_1'$ and $I_2'$ will then flow from the collector of transistor 50 to the output.

If $I_2'$ is greater than $I_1'$ the situation will be reversed. The diode 38 and the transistors 42 and 44 will be non-conducting and the diode 40 and the transistors 46 and 48 will be conducting. The difference current will be $I_1' - I_2'$ which will flow from the collector of the transistor 52 to the output.

While some applications of the above-described circuit have been mentioned there are numerous other applications including the use of an absolute value generator and mathematic operators such as function generators, multipliers, dividers and also in applications such as electronic tachometers and the like.

The terms and expressions which have been employed here are used as terms of description and not of limitations, and there is no intention, in the use of such terms and expressions of excluding equivalents of the features shown and described, or portions thereof, it being recognized that various modifications are possible within the scope of the invention as claimed.

What is claimed is:

1. An absolute value circuit for converting an input voltage signal of alternating polarity into a corresponding unipolar output current signal, the circuit comprising
    differential voltage to current converter means for converting the input voltage signal into a first current and a second current whose difference represents the voltage input signal,
    first slaved current inverter means for inverting the first current,
    second slaved current inverter means for inverting the second current,
    clamp and summer means having first and second signal input terminals, first and second control input terminals corresponding to the signal input terminals, and an output terminal, the clamp and summer means passing to the output terminal an input signal which is applied to one of the input signal terminals while a signal of an opposite polarity and predetermined magnitude is applied to the corresponding control input terminal,
    means for supplying the output of the first inverter means to the input of the second inverter means as well as to the first signal input terminal and the second control terminal of the clamp and summer means, and
    means for connecting the output of the second inverter means to the input of the first inverter means as well as to the second signal input terminal and the first control terminal of the clamp and summer means, whereby a unipolar current output signal is produced which is the difference of the first and second currents and which corresponds in magnitude to the input voltage signal.

2. The absolute value circuit as recited in claim 1 wherein the differential voltage to current converter means include integrating means and the difference of the first and second currents represents the time integral of the voltage input signal.

3. The absolute value circuit as recited in claim 1 wherein the differential voltage to current converter means include differentiating means and the difference of the first and second currents represents the differential with respect to time of the voltage input signal.

4. An absolute value circuit for converting an input voltage signal of alternating polarity into a corresponding unipolar output current signal, the circuit comprising
    first and second current sources,
    an impedance,
    a first amplifier having emitter, base and collector terminals,
    a second amplifier having emitter, base and collector terminals,
    the first current source being connected to supply current to the emitter of the first amplifier, the second current source being connected to supply current to the emitter of the second amplifier, the impedance being connected between the emitters of the first and second amplifiers, and the input voltage being applied between the base terminals of the first and second amplifiers, and further including
    first and second diodes,
    third, fourth, fifth, sixth, seventh and eighth amplifiers each having separate emitter, base and collector terminals,
    bias means, and wherein
    the collector of the first amplifier is connected to the anode of the first diode, the base of the seventh amplifier, the emitter of the eighth amplifier and the collector of the sixth amplifier,
    the collector of the second amplifier is connected to the anode of the second diode, the base of the eighth amplifier, the emitter of the seventh amplifier, and the collector of the fourth amplifier,
    the cathode of the first diode is connected to the collector and base of the third amplifier and to the base of the fourth amplifier,
    the cathode of the second diode is connected to the collector and the base of the fifth amplifier and to the base of the sixth amplifier,
    the emitters of the third, fourth, fifth and sixth amplifiers are connected to the bias means, and
    the collectors of the seventh and eighth amplifiers are connected together, whereby
    the unipolar output current is derived from the collectors of the seventh and eighth amplifiers and is the absolute value of twice the current flowing through the impedance.

5. The circuit as recited in claim 4 wherein the impedance comprises a resistor.

6. The circuit as recited in claim 4 wherein the impedance comprises a capacitor and the output current represents the differential with respect to time of the input voltage.

7. The circuit as recited in claim 4 wherein the impedance comprises an inductor and the output current represents the integral with respect to time of the input voltage.

8. The circuit as recited in claim 7 further comprising storage disc servo head means for generating the input voltage signal.

9. A method of converting an input voltage of alternating polarity into a corresponding unipolar, output current signal, the method comprising the steps of
converting the input voltage into first and second currents whose difference represents the integral with respect to time of the input voltage,
determining which of the two currents has the greater magnitude, and
taking the difference between the greater and lesser of the two currents to produce a unipolar output current.

10. A method of converting an input voltage of alternating polarity into a corresponding unipolar, output current signal, the method comprising the steps of
converting the input voltage into first and second currents whose difference represents the differential with respect to time of the input voltage,
determining which of the two currents has the greater magnitude, and
taking the difference between the greater and lesser of the two currents to produce a unipolar output current.

11. An absolute value circuit comprising differential voltage to current converter means for converting an input voltage of alternating polarity into a pair of currents whose difference represents the input voltage, said differential voltage to current converter means including integrating means and said difference representing the time integral of said input voltage, first and second inverter means for separately inverting each of the two currents, means for connecting the output of each inverter to the input of the other, the inverters being of the type which will only invert current of a predetermined polarity, and current summer and clamp means which are supplied with the outputs of the inverters for generating a unipolar output current signal whose magnitude represents the absolute value of the difference of the pair of currents.

12. An absolute value circuit comprising differential voltage to current converter means for converting an input voltage of alternating polarity into a pair of currents whose difference represents the input voltage, said differential voltage to current converter means including differentiating means and said difference representing the differential with respect to time of said input voltage, first and second inverter means for separately inverting each of the two currents, means for connecting the output of each inverter to the input of the other, the inverters being of the type which will only invert current of a predetermined polarity, and current summer and clamp means which are supplied with the outputs of the inverters for generating a unipolar output current signal whose magnitude represents the absolute value of the difference of the pair of currents.

13. The circuit as recited in claim 3 or 12 further comprising storage disc servo head means for generating the input voltage signal and wherein the voltage to current converting means generate currents whose difference represents the differential with respect to time of the input voltage signal.

* * * * *